United States Patent
Tetelbaum et al.

(10) Patent No.: US 7,480,881 B2
(45) Date of Patent: Jan. 20, 2009

(54) METHOD AND COMPUTER PROGRAM FOR STATIC TIMING ANALYSIS WITH DELAY DE-RATING AND CLOCK CONSERVATISM REDUCTION

(75) Inventors: Alexander Tetelbaum, Hayward, CA (US); Ruben Molina, San Ramon, CA (US); Subodh Bhike, Fremont, CA (US)

(73) Assignee: LSI Logic Corporation, Milpitas, CA (US)

(*) Notice: Subject to any disclaimer, the term of this patent is extended or adjusted under 35 U.S.C. 154(b) by 342 days.

(21) Appl. No.: 11/465,662

(22) Filed: Aug. 18, 2006

(65) Prior Publication Data

US 2008/0046848 A1    Feb. 21, 2008

(51) Int. Cl.
*G06F 17/50* (2006.01)
(52) U.S. Cl. .............................. 716/6; 716/4
(58) Field of Classification Search ............ 716/4, 716/6

See application file for complete search history.

(56) References Cited

U.S. PATENT DOCUMENTS 7,257,789 B2 * 8/2007 Hosono et al. ............... 716/6
7,406,669 B2 * 7/2008 Lindberg ...................... 716/3

OTHER PUBLICATIONS

M. Weber, "My Head Hurts, My Timing Stinks, and I Don't Love On-Chip Variation," Snug Boston, pp. 1-21, 2002.*

* cited by examiner

*Primary Examiner*—Jack Chiang
*Assistant Examiner*—Brandon W Bowers
(74) *Attorney, Agent, or Firm*—Eric James Whitesell

(57) ABSTRACT

A method and computer program for static timing analysis includes receiving as input minimum and maximum stage delays for two corners of an integrated circuit design. A path slack for a setup timing check is calculated from the minimum and maximum stage delays as a function of net clock cycle interval T_clk, launch path delay T_LP, capture path delay T_CP, data path delay T_DP, and a first delay de-rating factor Y1. A path slack for a hold timing check is calculated from the minimum and maximum stage delays as a function of the launch path delay T_LP, the capture path delay T_CP, the data path delay T_DP, and a second delay de-rating factor Y2. The path slack calculated for the setup timing check and for the hold timing check is generated as output.

34 Claims, 7 Drawing Sheets

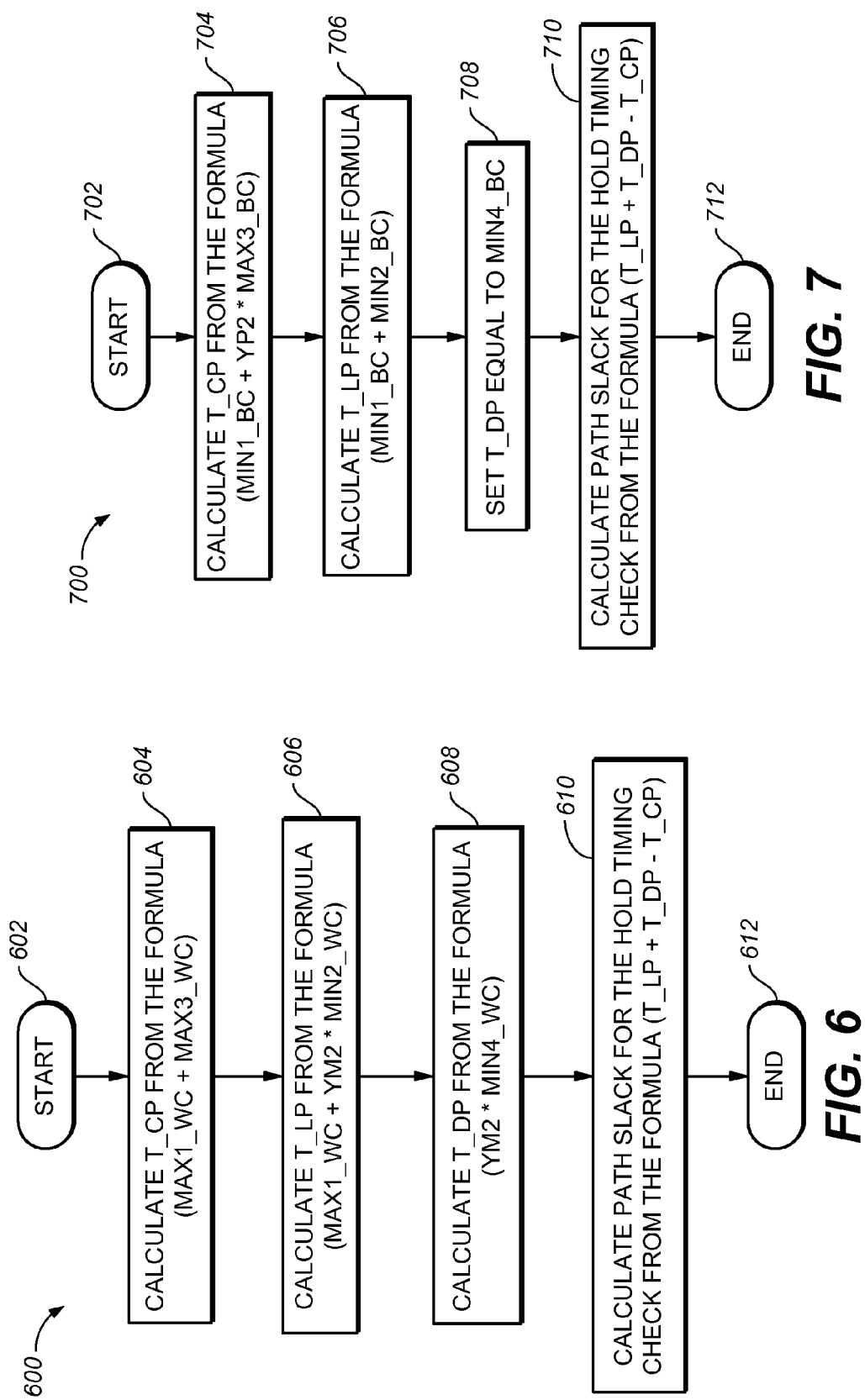

$800 \longrightarrow$

| EXAMPLES: | | T_clk = | 4000 | ps | | | |
|---|---|---|---|---|---|---|---|
| | | | | | | | |
| Y = | 0.1 | min1_wc = | 200 | ps | min1_bc = | 150 | ps |
| YM = | 0.9 | max1_wc = | 400 | ps | max1_bc = | 250 | ps |
| YP = | 1.1 | | | | | | |
| | | min2_wc = | 200 | ps | min2_bc = | 100 | ps |
| | | max2_wc = | 400 | ps | max2_bc = | 250 | ps |
| | | | | | | | |
| | | min3_wc = | 200 | ps | min3_bc = | 100 | ps |
| | | max3_wc = | 400 | ps | max3_bc = | 300 | ps |
| | | | | | | | |
| | | min4_wc = | 350 | ps | min4_bc = | 340 | ps |
| | | max4_wc = | 3600 | ps | max4_bc = | 3400 | ps |

Example 1 — 900

| Case | Mode | | Setup check for WC corner | | | |
|---|---|---|---|---|---|---|
| | De-rating | CRPR | Delay T_L of launch path | Delay T_C of capture path | Delay T_DP of data path | Slack = T_clk + T_C - T_L - T_DP |
| 1 | No | No | 800 | 400 | 3600 | 0 |
| 2* | Yes | No | 800 | 360 | 3600 | -40 |
| 3 | Yes | Yes | 800 | 580 | 3600 | 180 |

FIG. 10

Example 2 — 1000

| Case | Mode | | Setup check for BC corner | | | |
|---|---|---|---|---|---|---|
| | De-rating | CRPR | Delay T_L of launch path | Delay T_C of capture path | Delay T_DP of data path | Slack = T_clk + T_C - T_L - T_DP |
| 4 | No | No | 500 | 250 | 3400 | 350 |
| 5* | Yes | No | 550 | 250 | 3740 | -40 |
| 6 | Yes | Yes | 425 | 250 | 3740 | 85 |

FIG. 11

Example 3 — 1100

| Case | Mode | | Hold check for WC corner | | | |
|---|---|---|---|---|---|---|
| | De-rating | CRPR | Delay T_L of launch path | Delay T_C of capture path | Delay T_DP of data path | Slack = T_L + T_DP - T_C |
| 7 | No | No | 400 | 800 | 350 | -50 |
| 8 | Yes | No | 360 | 800 | 315 | -125 |
| 9* | Yes | Yes | 580 | 800 | 315 | 95 |

FIG. 12

Example 4 — 1200

| Case | Mode | | Hold check for BC corner | | | |
|---|---|---|---|---|---|---|
| | De-rating | CRPR | Delay T_L of launch path | Delay T_C of capture path | Delay T_DP of data path | Slack = T_L + T_DP - T_C |
| 10 | No | No | 250 | 550 | 340 | 40 |
| 11 | Yes | No | 250 | 605 | 340 | -15 |
| 12* | Yes | Yes | 250 | 480 | 340 | 110 |

METHOD AND COMPUTER PROGRAM FOR STATIC TIMING ANALYSIS WITH DELAY DE-RATING AND CLOCK CONSERVATISM REDUCTION

BACKGROUND OF THE INVENTION

1. Field of the Invention

The present invention is directed to integrated circuit design software used in the manufacture of integrated circuits. More specifically, but without limitation thereto, the present invention is directed to a method of static timing analysis of an integrated circuit design.

2. Description of Related Art

In a typical design flow used in the manufacture of integrated circuits, timing closure is performed for the integrated circuit design using a static timing analysis (STA) tool to find timing critical paths. A path is timing critical, for example, if it has a timing slack that is less than some positive limit, that is, the propagation delay of the path may not meet setup or hold time specifications due to cell delay, interconnect delay, and crosstalk delay.

SUMMARY OF THE INVENTION

In one aspect of the present invention, a method includes steps of:

receiving as input minimum and maximum stage delays for two corners of an integrated circuit design;

calculating path slack for a setup timing check from the minimum and maximum stage delays as a function of net clock cycle interval T_clk, launch path delay T_LP, capture path delay T_CP, data path delay T_DP, and a first delay de-rating factor Y1;

calculating path slack for a hold timing check from the minimum and maximum stage delays as a function of the launch path delay T_LP, the capture path delay T_CP, the data path delay T_DP, and a second delay de-rating factor Y2; and generating as output the path slack calculated for the setup timing check and for the hold timing check.

In another aspect of the present invention, a computer program product for estimating a total path delay in an integrated circuit design includes:

a medium for embodying a computer program for input to a computer; and a computer program embodied in the medium for causing the computer to perform steps of:

receiving as input minimum and maximum stage delays for two corners of an integrated circuit design;

calculating path slack for a setup timing check from the minimum and maximum stage delays as a function of net clock cycle interval T_clk, launch path delay T_LP, capture path delay T_CP, data path delay T_DP, and a first delay de-rating factor Y1;

calculating path slack for a hold timing check from the minimum and maximum stage delays as a function of the launch path delay T_LP, the capture path delay T_CP, the data path delay T_DP, and a second delay de-rating factor Y2; and generating as output the path slack calculated for the setup timing check and for the hold timing check.

BRIEF DESCRIPTION OF THE DRAWINGS

The present invention is illustrated by way of example and not limitation in the accompanying figures, in which like references indicate similar elements throughout the several views of the drawings, and in which:

FIG. 6 illustrates a flow chart of a method for calculating path slack for a worst case hold timing check for the flow chart of FIG. 3;

FIG. 7 illustrates a flow chart of a method for calculating path slack for a best case hold timing check for the flow chart of FIG. 3;

FIG. 8 illustrates a table of an exemplary set of path delays for worst case and best case corners for the clocked net of FIG. 2;

FIG. 9 illustrates a table comparing values of worst case setup timing path slack according to method of FIG. 1 and the method of FIG. 3 using the corner delays from FIG. 8;

FIG. 10 illustrates a table comparing values of best case setup timing path slack calculated according to method of FIG. 1 and the method of FIG. 3;

FIG. 11 illustrates a table comparing values of worst case hold timing path slack calculated according to method of FIG. 1 and the method of FIG. 3; and FIG. 12 illustrates a table comparing values of best case hold timing path slack calculated according to method of FIG. 1 and the method of FIG. 3.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

In several methods used for static timing analysis of integrated circuit designs, estimated values for setup and hold delays in clocked nets are adjusted, or de-rated, to account for process, voltage, and temperature (PVT) variations to ensure that the integrated circuit will perform within specifications. To avoid de-rating the estimated setup and hold delay values by an unrealistically high amount, a technique referred to as clock re-convergence pessimism reduction (CRPR) may be used to moderate the effect of de-rating.

Figure 1:
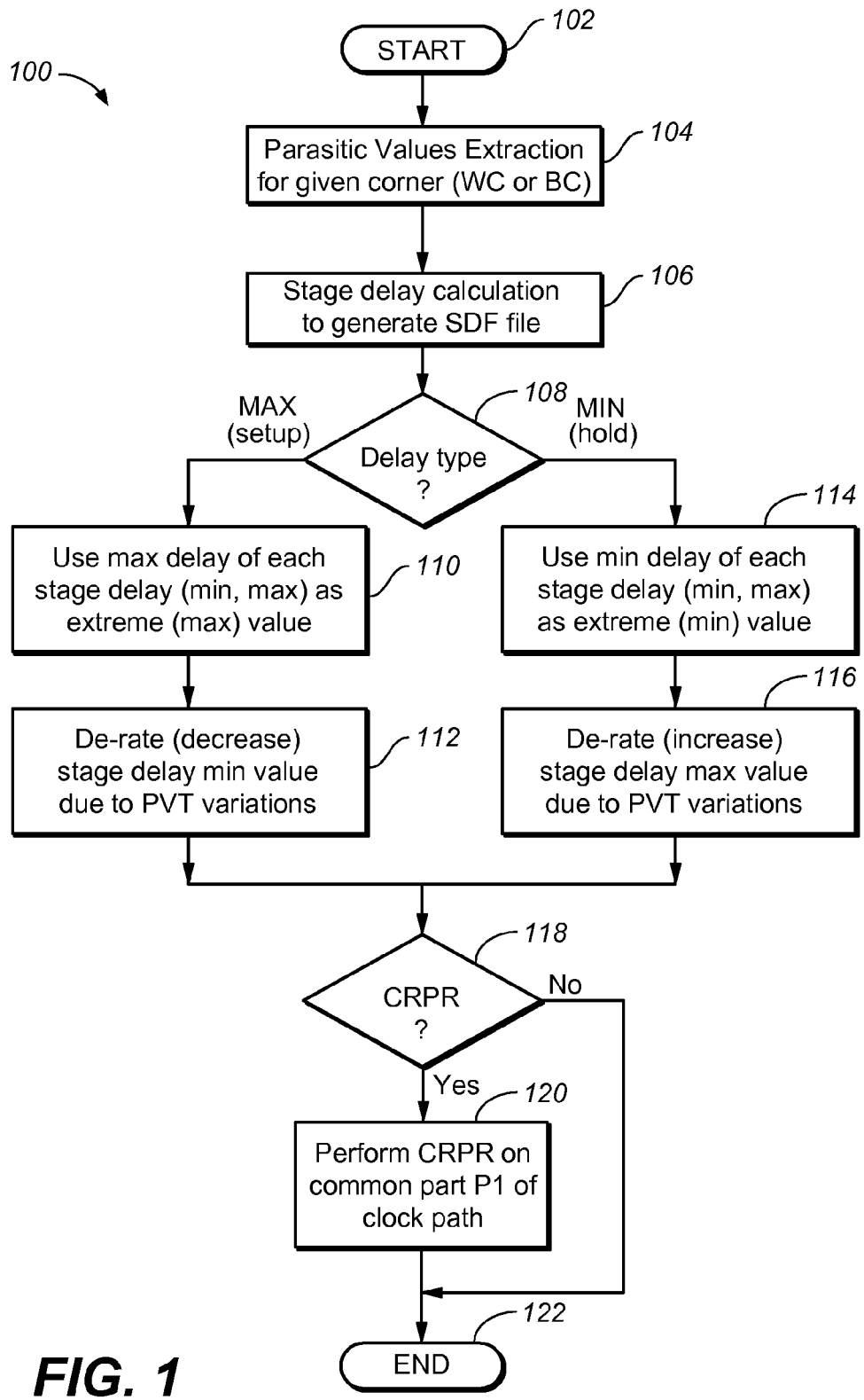
FIG. 1 illustrates a flow chart for estimating setup and hold timing path slack for a static analysis timing tool according to the prior art.

FIG. 1 illustrates a flow chart 100 for estimating setup and hold delays for a static analysis timing tool according to the prior art.

Step 102 is the entry point of the flow chart 100.

In step 104, a parasitic extraction is performed to determine cell delays and interconnect delays for each cell in the integrated circuit design.

In step 106, the cell delay and the corresponding interconnect delay are summed to calculate a maximum and a minimum stage delay for each cell in the integrated circuit design. The stage delays are typically recorded in a standard delay format (SDF) file that is compatible with a wide variety of commercially available static timing analysis tools.

In step 108, the delay type is selected for calculating path slack for setup time or hold time. If setup timing is selected, the method continues from step 110. Otherwise, the method continues from step 114.

In step 110, the maximum stage delay value for each stage is used to estimate a maximum extreme (worst case) setup timing delay.

In step 112, the minimum stage delay value for each stage is multiplied by (1−delay de-rating factor) to estimate a minimum (best case) setup timing delay to allow for PVT variations. The delay de-rating factor is a number less than one, for example, 0.1. The method continues from step 118.

In step 114, the minimum stage delay value for each stage in the clocked net is used to estimate a minimum extreme (worst case) hold timing delay.

In step 116, the maximum stage delay value for each stage is multiplied by (1+delay de-rating factor) to estimate a maximum (best case) hold timing delay to allow for PVT variations.

In step 118, an optional clock re-convergence pessimism reduction may be applied. When the option is enabled, which is typically the default, the method continues from step 120. Otherwise, the method continues from step 122.

In step 120, the portion of the delay that accumulates in the portion of the net clock path that is shared by the launch clock and the capture clock is removed from the maximum (worst case) setup delay and the minimum (best case) setup delay.

Step 122 is the exit point of the flow chart 100.

The method illustrated in FIG. 1 may result in slack timing estimation errors that appear as false timing violations being reported by the static timing analysis tool and real timing violations not being reported by the static timing analysis tool. Some of reasons for these problems include applying PVT de-rating and clock re-convergence pessimism reduction to the estimates of both the setup time and the hold time. If timing slack is calculated without clock re-convergence pessimism reduction, then all hold time checks for worst case and best case may be pessimistic, that is, the reported path slack may be less then the actual path slack. On the other hand, If path slack is calculated with clock re-convergence pessimism reduction, then all setup time checks for worst case and best case may be optimistic, that is, the reported path slack is more than the actual path slack, which may mask a real timing violation.

Another disadvantage of the method of FIG. 1 is that clock re-convergence pessimism reduction is applied in conjunction with both PVT variations and crosstalk variations. Clock re-convergence pessimism reduction is properly applied in conjunction with PVT variations, because PVT variations are negligible from one clock cycle to the next. However, clock re-convergence pessimism reduction is not appropriately applied in conjunction with crosstalk variations. This is because crosstalk variations in the first clock cycle, the launch cycle, may induce a longer delay (slow-down) in the portion of the net clock path that is common to, that is, shared by, the launch clock and the capture clock. However, in the second clock cycle, the capture cycle, crosstalk variations may induce a shorter delay (speed-up) in the portion of the net clock path that is common to the launch clock and the capture clock.

A further disadvantage of the method of FIG. 1 is that it cannot properly apply delay de-rating due to PVT variations and clock re-convergence pessimism reduction, because they are applied in the same manner to both the worst case and best case limits, or corners.

The problems described above are advantageously avoided by the method of static timing analysis described below.

In one embodiment, a method of static timing analysis includes steps of:

receiving as input minimum and maximum stage delays for two corners of an integrated circuit design;

calculating path slack for a setup timing check from the minimum and maximum stage delays as a function of net clock cycle interval T_clk, launch path delay T_LP, capture path delay T_CP, data path delay T_DP, and a first delay de-rating factor Y1;

calculating path slack for a hold timing check from the minimum and maximum stage delays as a function of the launch path delay T_LP, the capture path delay T_CP, the data path delay T_DP, and a second delay de-rating factor Y2; and generating as output the path slack calculated for the setup timing check and for the hold timing check.

Figure 2:
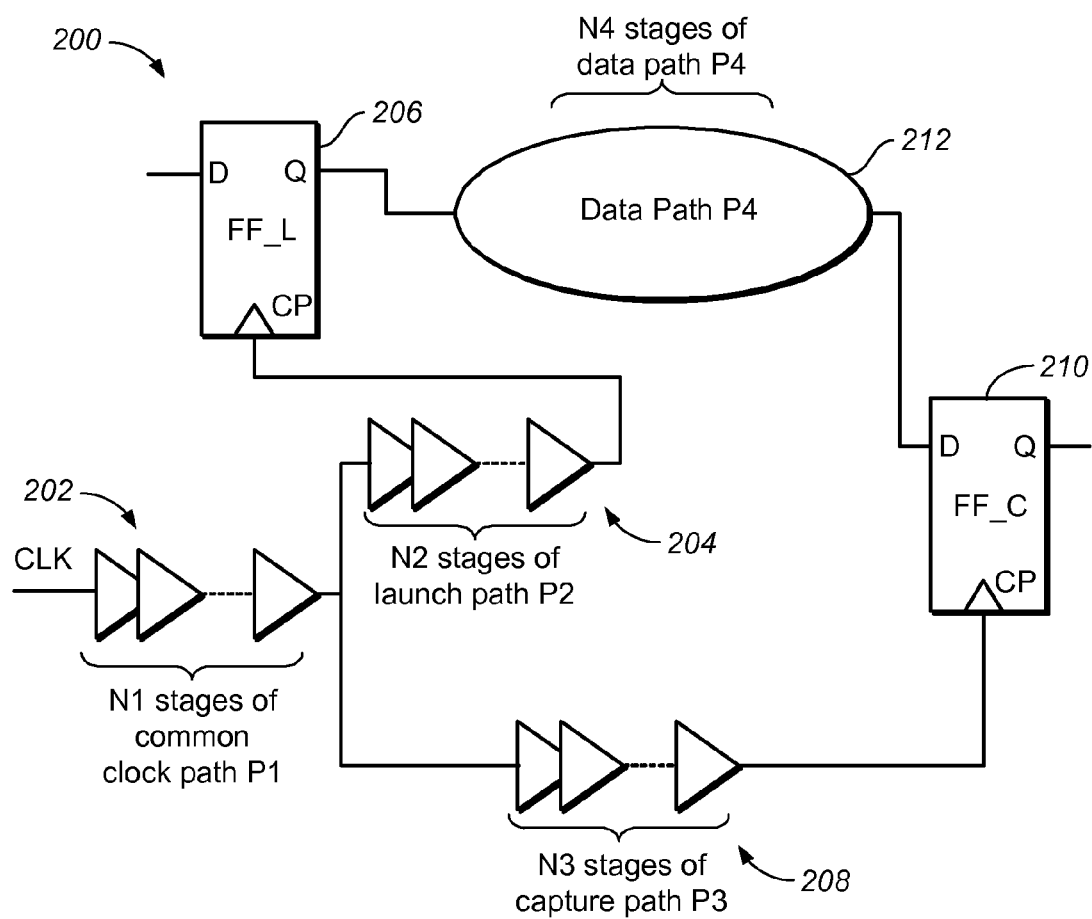
FIG. 2 illustrates an example of a clocked net for which setup and hold timing path slack is to be calculated by a static timing analysis tool.

FIG. 2 illustrates an example of a clocked net 200 for which setup and hold timing path slack is to be calculated by a static timing analysis tool. Shown in FIG. 2 are a common clock path P1 202, a launch clock path P2 204, a launch flip-flop 206, a capture clock path P3 208, a capture flip-flop 210, and a data path P4 212.

In FIG. 2, the net clock signal CLK is propagated over the common clock path 202 and the launch clock path 204 to the launch flip-flop 206. Concurrently, the net clock signal CLK is propagated over the common clock path 202 and the capture clock path 208 to the capture flip-flop 206.

A selected set of operating conditions for an integrated circuit design is called a corner. For each corner pair, for example, worst case (WC) and best case (BC), design parasitic values are extracted to perform a delay analysis. As a result, a pair of minimum and maximum worst case delays (min_wc, max_wc) is obtained for each stage (cell delay plus interconnect delay) for the worst case corner and a pair of minimum and maximum best case delays (min_bc, max_bc) is obtained for each stage for the best case corner. The maximum worst case max_wc is the extreme (maximum) value of stage delay for the worst case operating conditions, the worst case PVT variations, and worst case crosstalk slowdown. The minimum best case min_bc is the extreme (minimum) value of stage delay for best case operating conditions, the worst case PVT variations, and crosstalk speed up.

Also, min_wc stage delay takes into account worst case speed up crosstalk variation (or any other clock-dependent variation, also called fast variations, but does not include possible speed-up due to PVT variations, also called permanent or slow variations. Consequently, if there are no fast variations, then min_wc=max_wc. Likewise, max_bc stage delay takes into account worst case slow-down crosstalk variation (or any other clock-dependent or fast variation, but does not include possible slow-down due to PVT variations, that is, permanent or slow variations. If there are no fast variations, then max_bc=min_bc. Thus, the delays min_wc and max_bc are subject to additional de-rating during setup and hold checks to take into account PVT or slow variations.

The common clock path P1 202 in FIG. 2 has N1 stages including clock buffers and clock nets. The total delay (min1, max1) along the common clock path P1 202 is equal to the sum of the stage delays. For worst case, the delay pair is (min1_wc, max1_wc) and for best case, the delay pair is (min1_bc, max1_bc).

The launch clock path P2 204 has N2 stages (clock buffers and clock nets) and is connected to the clock pin CP of the data launch flip-flop 206. The total delay (min2, max2) along the launch clock path P2 204 is equal to the sum of the stage delays. For worst case, the delay pair is (min2_wc, max2_wc). For best case, the delay pair is (min2_bc, max2_bc).

The capture clock path P3 206 has N3 stages (clock buffers and clock nets) and is connected to the clock pin CP of the data capture flip-flop 210. The total delay (min3, max3) along the capture clock path P3 206 is equal to the sum of the stage delays. For worst case, the delay pair is (min3_wc, max3_wc). For best case, the delay pair is (min3_bc, max3_bc).

The data path P4 212 has N4 stages and starts at clock pin CP of the data launch flip-flop 206 and ends at data input D of the data capture flip-flop 210. The data path P4 212 has a delay T_DP={min4 OR max4}. The choice of the minimum or the maximum value of the delay T_DP depends on the type of timing check, for example, setup timing check or hold timing check.

The overall launch clock path P2' is equal to the sum of the common data path P1 and the incremental launch path P2. The launch path P2' has a delay T_L={min1 OR max1}+{min2 OR max2}. The choice of the minimum or the maximum value of the delay T_L depends on type of timing check.

The overall capture clock path P3' is equal to the sum of paths P1 and the incremental capture path P3. The capture path P3' has a delay T_C={min1 OR max1}+{min3 OR max3}. The choice of the minimum or the maximum value of the delay T_C depends on type of timing check.

For convenience, the following symbols are used to simplify the notation:

T_L is the delay of the launch clock at the CP input of the launch flip-flop 206 from the CLK signal input along the path P2';

T_C is the delay of the capture clock at the CP input of the capture flip-flop 210 from the CLK signal input along the path P3';

T_DP is the delay along the data path P4 212;

T_clk is the clock period;

Y is a delay de-rating factor, for example, 0.1, that accounts for PVT variations. Some path delays are increased by Y or decreased by Y depending on operating conditions and type of timing check. In various embodiments contemplated within the scope of the appended claims, a first delay de-rating factor Y1 may be used for setup timing checks and a second de-rating factor Y2 may be used for hold timing checks. In general, the values of Y1 and Y2 are the same; however, the values of Y1 and Y2 may differ to suit specific applications.

YMi=1−Yi is a de-rating multiplier to reduce delay, for example, for minimum delays for a worst case setup timing check; and YPi=1+Yi is a de-rating multiplier to increase delay, for example, for maximum delays for a best case hold timing check.

Typically, a parasitic extraction and timing checks are performed for two corners. A corner is a selected set of operating conditions for an integrated circuit design, for example, worst case and best case. Setup and hold timing checks are then performed for the two corners. Other corner pairs, for example, worst case and typical case, absolute minimum voltage and absolute maximum voltage, and so on, may be used to practice various embodiments within the scope of the appended claims.

For worst case, when the maximum stage delay value is an extreme maximum value (including PVT variations) during a setup timing check, the minimum delay value is calculated without taking into account PVT variations. Consequently, the minimum delay value is a subject to YM de-rating (reduction).

For best case, when the minimum stage delay value is an extreme minimum value (including PVT variations) during a hold timing check, the maximum delay value is calculated without taking into account PVT variations. Consequently, the maximum delay value is a subject to YP de-rating (increase).

Clock re-convergence pessimism is a result of a difference in delay along the common path P1 of the launch path P2' and the capture path P3'. Because the same path has the same delay for both the launch path P2' and the capture path P3', clock re-convergence pessimism introduces an error into static timing analysis and is therefore an undesired effect. Accordingly, clock re-convergence pessimism is preferably removed during static timing analysis for better accuracy.

A difference in delay between the capture path P3' and the launch path P2' may occur due to path-based delay de-rating, also called on-chip-variation. Other well-known causes of a difference in delay between the capture path P3' and the launch path P2' include min-max slew propagation, re-convergent clock paths, and the dynamic nature of crosstalk delays.

Crosstalk delay is an induced change in the delay of a victim net that is dynamic in nature, depending on the timing windows of aggressor nets and the victim net. Due to crosstalk delay, each stage or path delay has a pair of delays (min, max). The difference between the maximum and minimum delays is called the delta delay. In a setup timing check, crosstalk slows down the launch path P2' and the data path P4 and speeds up the capture path P3'. In a hold timing check, crosstalk speeds up the launch path P2' and the data path P4 and slows down the capture path P3'. Excessive pessimism may be introduced in the static timing analysis due to the difference in crosstalk delay applied to the launch path P2' and the capture path P3'.

Zero Cycle Checks are timing checks in which the same clock edge drives the launch flip-flop 206 and the capture flip-flop 210 in FIG. 2, for example, in a hold timing check. Clock re-convergence pessimism reduction (CRPR) is preferably applied to hold timing checks, because any change in delay in the common path P1 will identically impact the clock arrival time at the launch flip-flop 206 and the capture flip-flop 210.

Non-zero Cycle Checks are timing checks in which different clock edges drive the launch flip-flop 206 and the capture flip-flop 210, for example, during a setup timing check. Specifically, for a setup timing check the capture flip-flop 210 (or register) is triggered by a first clock edge, and the launch flip-flop 206 (or register) is triggered by the next clock edge. Consequently, the dynamic crosstalk delay in the common path P1 may slow down the first clock edge and speed up the next clock edge. Conversely, the dynamic crosstalk delay in the common path P1 may speed up the first clock edge and slow down the next clock edge. Accordingly, clock re-convergence pessimism reduction is preferably not applied to setup timing checks.

Due to the dynamic nature of delta delays, different criteria are used to remove CRPR from static timing analysis. In the SDF based signoff flow of FIG. 1, the delta delay due to crosstalk is merged with the net delay. Due to an inability to separate delta delays from the total delay in the SDF based flow, the clock re-convergence pessimism calculation is same as for any other non-signal integrity (SI) delay. This may cause an additional pessimism in delay analysis and inconsistencies in static timing analysis results between different types of circuit design tools and signoff flows.

Figure 3:
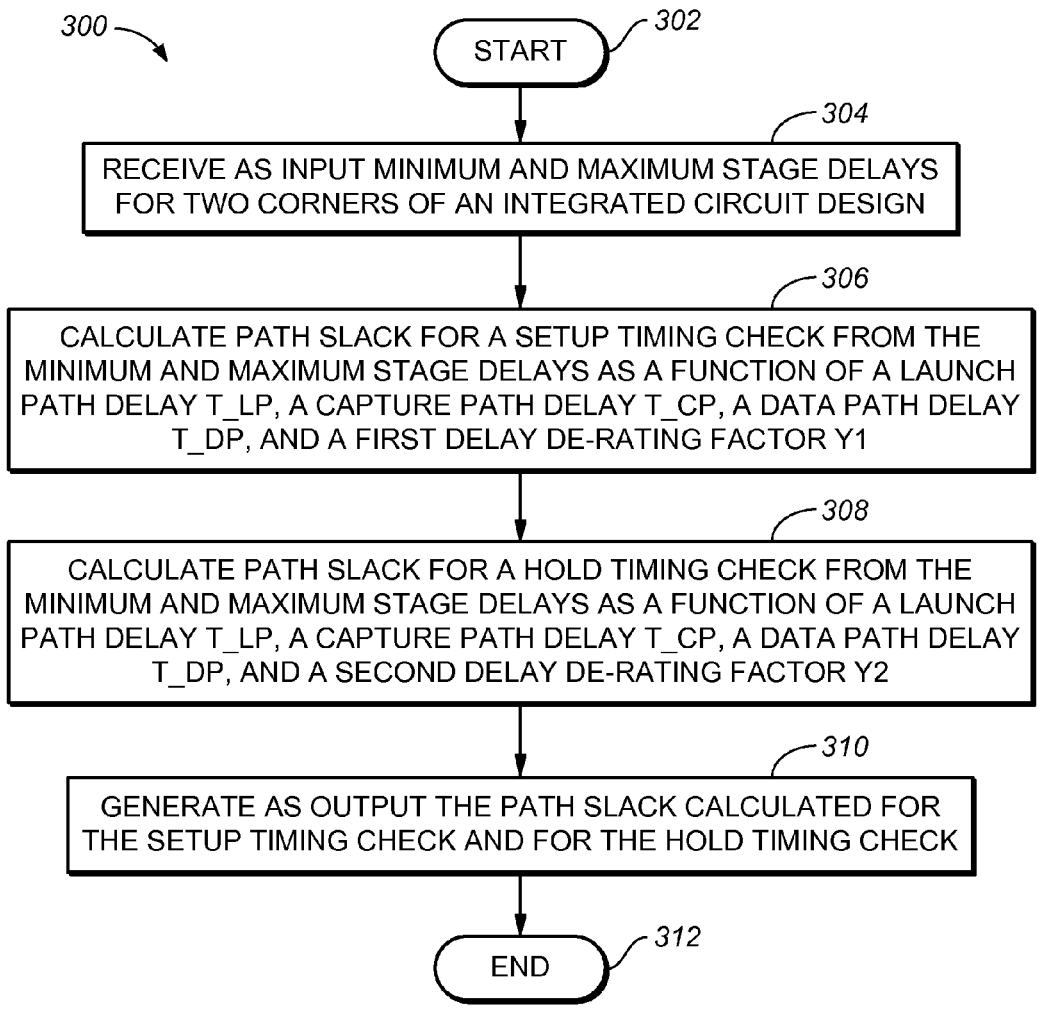
FIG. 3 illustrates a flow chart of a method of static timing analysis that correctly implements delay de-rating and clock re-convergence pessimism reduction (CRPR)

FIG. 3 illustrates a flow chart 300 of a method of static timing analysis that correctly implements delay de-rating and clock re-convergence pessimism reduction (CRPR).

Step 302 is the entry point of the flow chart 300.

In step 304, minimum and maximum stage delays are received as input for a clocked net of an integrated circuit design, for example, from a standard delay format (SDF) file.

In step 306, path slack is calculated for a setup timing check from the minimum and maximum stage delays as a function of a launch path delay T_LP, a capture path delay T_CP, a data path delay T_DP, and a first delay de-rating factor Y1.

In step 308, path slack is calculated for a hold timing check from the minimum and maximum stage delays as a function of a net clock cycle interval T_clk, a launch path delay T_LP, a capture path delay T_CP, a data path delay T_DP, and a second delay de-rating factor Y2.

In step 310, the path slack calculated for the setup timing check and for the hold timing check is generated as output.

Step 312 is the exit point of the flow chart 300.

For setup timing checks, the launch path delay T_LP, the capture path delay T_CP, and the data path delay T_DP may be calculated as described below for FIGS. 4 and 5.

Figures 4, 5:
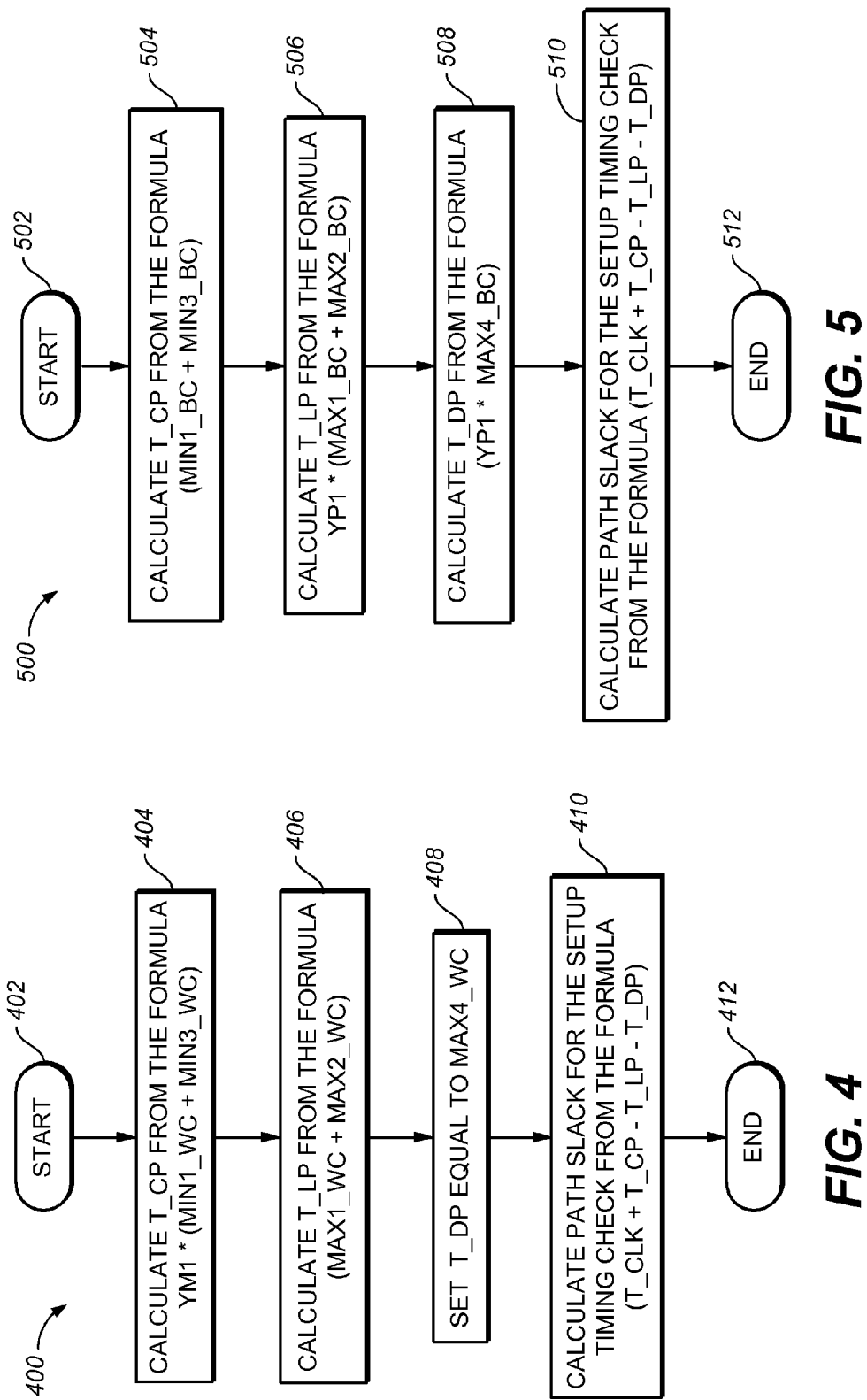
FIG. 4 illustrates a flow chart of a method for calculating path slack for a worst case setup timing check for the flow chart of FIG. 3.
FIG. 5 illustrates a flow chart of a method for calculating path slack for a best case setup timing check for the flow chart of FIG. 3.

FIG. 4 illustrates a flow chart 400 of a method for calculating path slack for a worst case setup timing check for the flow chart of FIG. 3.

Step 402 is the entry point of the flow chart 400.

In step 404, T_CP is calculated from the formula YM1*(min1_wc+min3_wc), where min1_wc is a minimum worst case delay for a common path segment and min3_wc is a minimum worst case incremental capture path delay.

In step 406, T_LP is calculated from the formula (max1_wc+max2_wc), where max1_wc is a maximum worst case delay for a common path segment and max2_wc is a maximum worst case incremental launch path delay.

In step 408, T_DP is set equal to max4_wc, where max4_wc is a maximum worst case data path delay.

In step 410, the path slack for the setup timing check is calculated from the formula (T_clk+T_CP−T_LP−T_DP).

Step 412 is the exit point of the flow chart 400.

FIG. 5 illustrates a flow chart 500 of a method for calculating path slack for a best case setup timing check for the flow chart of FIG. 3.

Step 502 is the entry point of the flow chart 500.

In step 504, T_CP is calculated from the formula (min1_bc+min3_bc), where min1_bc is a minimum best case delay for a common path segment and min3_bc is a minimum best case incremental capture path delay.

In step 506, T_LP is calculated from the formula YP1*(max1_bc+max2_bc), where max1_bc is a maximum best case delay for a common path segment and max2_bc is a maximum best case incremental launch path delay.

In step 508, T_DP is calculated from the formula (YP1*max4_bc), where max4_bc is a maximum best case data path delay.

In step 510, the path slack for the setup timing check is calculated from the formula (T_clk+T_CP−T_LP−T_DP).

Step 512 is the exit point of the flow chart 500.

FIG. 6 illustrates a flow chart 600 of a method for calculating path slack for a worst case hold timing check for the flow chart of FIG. 3.

Step 602 is the entry point of the flow chart 600.

In step 604, T_CP is calculated from the formula (max1_wc+max3_wc), where max1_wc is a maximum worst case delay for a common path segment and max3_wc is a maximum worst case incremental capture path delay.

In step 606, T_LP is calculated from the formula (max1_wc+YM2*min2_wc), where max1_wc is a maximum worst case delay for a common path segment and min2_wc is a minimum worst case incremental launch path delay.

In step 608, T_DP is calculated from the formula (YM2*min4_wc), where min4_wc is a minimum worst case data path delay.

In step 610, the path slack for the hold timing check is calculated from the formula (T_LP+T_DP−T_CP).

Step 612 is the exit point of the flow chart 600.

FIG. 7 illustrates a flow chart 700 of a method for calculating path slack for a best case hold timing check for the flow chart of FIG. 3.

Step 702 is the entry point of the flow chart 700.

In step 704, T_CP is calculated from the formula (min1_bc+YP2*max3_bc), where min1_wc is a minimum worst case delay for a common path segment and max3_bc is a maximum best case incremental capture path delay.

In step 706, T_LP is calculated from the formula (min1_bc+min2_bc), where min1_bc is a minimum best case delay for a common path segment and min2_bc is a minimum best case incremental launch path delay.

In step 708, T_DP is set equal to min4_bc, where min4_bc is a minimum best case data path delay.

In step 710, the path slack for the hold timing check is calculated from the formula (T_LP+T_DP−T_CP).

Step 712 is the exit point of the flow chart 700.

FIG. 8 illustrates a table 800 of an exemplary set of path delays for worst case and best case corners for the clocked net of FIG. 2. In this example, the de-rating delay factor Y=Y1=Y2=0.1 is used to calculate (1−Y1)=(1−Y2)=YM1=YM2=0.9 and (1+Y1)=(1+Y2)=YP=YP2=1.1. The path delays in the table 800 are used to compare the path slack calculated according to the method of FIG. 1 and the method of FIG. 3.

FIG. 9 illustrates a table 900 comparing values of worst case setup timing path slack calculated according to method of FIG. 1 and the method of FIG. 3. In FIG. 9, delay de-rating and clock re-convergence pessimism reduction (CRPR) are correctly applied in case 2* (the method of FIG. 3) and misapplied in cases 1 and 3 (the method of FIG. 1). As a result, the estimated path slack is overly pessimistic in case 1 and overly optimistic in case 3.

FIG. 10 illustrates a table 1000 comparing values of best case setup timing path slack calculated according to method of FIG. 1 and the method of FIG. 3. In FIG. 10, delay de-rating and clock re-convergence pessimism reduction (CRPR) are correctly applied in case 5* (the method of FIG. 3) and misapplied in cases 4 and 6 (the method of FIG. 1). As a result, the estimated path slack in both cases 4 and 6 is overly optimistic.

FIG. 11 illustrates a table 1100 comparing values of worst case hold timing path slack calculated according to method of FIG. 1 and the method of FIG. 3. In FIG. 11, delay de-rating and clock re-convergence pessimism reduction (CRPR) are correctly applied in case 9* (the method of FIG. 3) and misapplied in cases 7 and 8 (the method of FIG. 1). As a result, the estimated path slack in both cases 7 and 8 is overly pessimistic.

FIG. 12 illustrates a table 1200 comparing values of best case hold timing path slack calculated according to method of FIG. 1 and the method of FIG. 3. In FIG. 12, delay de-rating and clock re-convergence pessimism reduction (CRPR) are correctly applied in case 12* (the method of FIG. 3) and misapplied in cases 10 and 11 (the method of FIG. 1). As a result, the estimated path slack is overly optimistic in cases 10 and 11.

As may be appreciated from FIGS. 9-12, the method of FIG. 3 properly applies delay de-rating and CRPR to estimate path timing slack for setup and hold timing checks, advantageously avoiding both false and omitted timing violations from the static timing analysis.

Although the method illustrated by the flowchart descriptions above is described and shown with reference to specific steps performed in a specific order, these steps may be combined, sub-divided, or reordered without departing from the scope of the claims. Unless specifically indicated herein, the order and grouping of steps is not a limitation of the present invention.

The flow chart described above may also be implemented by instructions for being performed on a computer. The instructions may be embodied in a disk, a CD-ROM, and other computer readable media according to well known computer programming techniques.

In another embodiment, a computer program product for estimating a total path delay in an integrated circuit design includes:

a medium for embodying a computer program for input to a computer; and a computer program embodied in the medium for causing the computer to perform steps of:

receiving as input minimum and maximum stage delays for two corners of an integrated circuit design;

calculating path slack for a setup timing check from the minimum and maximum stage delays as a function of net clock cycle interval T_clk, launch path delay T_LP, capture path delay T_CP, data path delay T_DP, and a first delay de-rating factor Y1;

calculating path slack for a hold timing check from the minimum and maximum stage delays as a function of the launch path delay T_LP, the capture path delay T_CP, the data path delay T_DP, and a second delay de-rating factor Y2; and generating as output the path slack calculated for the setup timing check and for the hold timing check.

While the invention herein disclosed has been described by means of specific embodiments and applications thereof, numerous modifications and variations could be made thereto by those skilled in the art without departing from the scope of the invention set forth in the following claims.

The specific embodiments and applications thereof described above are for illustrative purposes only and do not preclude modifications and variations that may be made within the scope of the following claims.

What is claimed is:

1. A method of static timing analysis comprising steps of:
receiving as input minimum and maximum stage delays for two corners of an integrated circuit design;
calculating path slack for a setup timing check from the minimum and maximum stage delays as a function of net clock cycle interval T_clk, launch path delay T_LP, capture path delay T_CP, data path delay T_DP, and a first delay de-rating factor Y1;
calculating path slack for a hold timing check from the minimum and maximum stage delays as a function of the launch path delay T_LP, the capture path delay T_CP, the data path delay T_DP, and a second delay de-rating factor Y2; and
generating as output the path slack calculated for the setup timing check and for the hold timing check.

2. The method of claim 1 further comprising calculating T_CP from the formula $(1-Y1)*(min1\_wc+min3\_wc)$, where min1_wc is a minimum worst case delay for a common path segment, and min3_wc is a minimum worst case incremental capture path delay.

3. The method of claim 2 further comprising calculating T_LP from the formula $(max1\_wc+max2\_wc)$, where max1_wc is a maximum worst case delay for a common path segment, and max2_wc is a maximum worst case incremental launch path delay.

4. The method of claim 3 further comprising setting T_DP equal to max4_wc, where max4_wc is a maximum worst case data path delay.

5. The method of claim 4 further comprising calculating path slack for the setup timing check from the formula $(T\_clk+T\_CP-T\_LP-T\_DP)$.

6. The method of claim 1 further comprising calculating T_CP from the formula $(min1\_bc+min3\_bc)$, where min1_bc is a minimum best case delay for a common path segment, and min3_bc is a minimum best case incremental capture path delay.

7. The method of claim 6 further comprising calculating T_LP from the formula $(1+Y1)*(max1\_bc+max2\_bc)$, where max1_bc is a maximum best case delay for a common path segment, and max2_bc is a maximum best case incremental launch path delay.

8. The method of claim 7 further comprising calculating T_DP from the formula $(1+Y1)*max4\_bc$, where max4_bc is a maximum best case data path delay.

9. The method of claim 8 further comprising calculating path slack for the setup timing check from the formula $(T\_clk+T\_CP-T\_LP-T\_DP)$.

10. The method of claim 1 further comprising calculating T_CP from the formula $(max1\_wc+max3\_wc)$, where max1_wc is a maximum worst case delay for a common path segment, and max3_wc is a maximum worst case incremental capture path delay.

11. The method of claim 10 further comprising calculating T_LP from the formula $(max1\_wc+(1-Y2)*min2\_wc)$, where max1_wc is a maximum worst case delay for a common path segment, and min2_wc is a minimum worst case incremental launch path delay.

12. The method of claim 11 further comprising calculating T_DP from the formula $(1-Y1)*min4\_wc$, where min4_wc is a minimum worst case data path delay.

13. The method of claim 12 further comprising calculating path slack for the hold timing check from the formula $(T\_LP+T\_DP-T\_CP)$.

14. The method of claim 1 further comprising calculating T_CP from the formula $(min1\_bc+(1+Y1)*max3\_bc)$, where min1_wc is a minimum worst case delay for a common path segment, and max3_bc is a maximum best case incremental capture path delay.

15. The method of claim 14 further comprising calculating T_LP from the formula $(min1\_bc+min2\_bc)$, where min1_bc is a minimum best case delay for a common path segment, and min2_bc is a minimum best case incremental launch path delay.

16. The method of claim 15 further comprising setting T_DP equal to min4_bc, where min4_bc is a minimum best case data path delay.

17. The method of claim 16 further comprising calculating path slack for the hold timing check from the formula $(T\_LP+T\_DP-T\_CP)$.

18. A computer program product for optimizing register transfer level code for an integrated circuit design comprising a medium for embodying a computer program for input to a computer and a computer program embodied in the medium for causing the computer to perform steps of:

receiving as input minimum and maximum stage delays for two corners of an integrated circuit design;

calculating path slack for a setup timing check from the minimum and maximum stage delays as a function of net clock cycle interval T_clk, launch path delay T_LP, capture path delay T_CP, data path delay T_DP, and a first delay de-rating factor Y1;

calculating path slack for a hold timing check from the minimum and maximum stage delays as a function of the launch path delay T_LP, the capture path delay T_CP, the data path delay T_DP, and a second delay de-rating factor Y2; and generating as output the path slack calculated for the setup timing check and for the hold timing check.

19. The computer program product of claim 18 further comprising calculating T_CP from the formula (1−Y1)*(min1_wc+min3_wc), where min1_wc is a minimum worst case delay for a common path segment, and min3_wc is a minimum worst case incremental capture path delay.

20. The computer program product of claim 19 comprising calculating T_LP from the formula (max1_wc+max2_wc), where max1_wc is a maximum worst case delay for a common path segment, and max2_wc is a maximum worst case incremental launch path delay.

21. The computer program product of claim 20 further comprising setting T_DP equal to max4_wc, where max4_wc is a maximum worst case data path delay.

22. The computer program product of claim 21 further comprising calculating path slack for the setup timing check from the formula (T_clk+T_CP−T_LP−T_DP).

23. The computer program product of claim 18 further comprising calculating T_CP from the formula (min1_bc+min3_bc), where min1_bc is a minimum best case delay for a common path segment, and min3_bc is a minimum best case incremental capture path delay.

24. The computer program product of claim 23 further comprising calculating T_LP from the formula (1+Y1)*(max1_bc+max2_bc), where max1_bc is a maximum best case delay for a common path segment, and max2_bc is a maximum best case incremental launch path delay.

25. The computer program product of claim 24 further comprising calculating T_DP from the formula (1+Y1)*max4_bc, where max4_bc is a maximum best case data path delay.

26. The computer program product of claim 25 further comprising calculating path slack for the setup timing check from the formula (T_clk+T_CP−T_LP−T_DP).

27. The computer program product of claim 18 further comprising calculating T_CP from the formula (max1_wc+max3_wc), where max1_wc is a maximum worst case delay for a common path segment, and max3_wc is a maximum worst case incremental capture path delay.

28. The computer program product of claim 27 further comprising calculating T_LP from the formula (max1_wc+(1−Y2)*min2_wc), where max1_wc is a maximum worst case delay for a common path segment, and min2_wc is a minimum worst case incremental launch path delay.

29. The computer program product of claim 27 comprising calculating T_DP from the formula (1−Y2)*min4_wc, where min4_wc is a minimum worst case data path delay.

30. The computer program product of claim 29 further comprising calculating path slack for the hold timing check from the formula (T_LP+T_DP−T_CP).

31. The computer program product of claim 18 further comprising calculating T_CP from the formula (min1_bc+(1+Y2)*max3_bc), where min1_wc is a minimum worst case delay for a common path segment, and max3_bc is a maximum best case incremental capture path delay.

32. The computer program product of claim 31 further comprising calculating T_LP from the formula (min1_bc+min2_bc), where min1_bc is a minimum best case delay for a common path segment, and min2_bc is a minimum best case incremental launch path delay.

33. The computer program product of claim 32 further comprising setting T_DP equal to min4_bc, where min4_bc is a minimum best case data path delay.

34. The computer program product of claim 33 further comprising calculating path slack for the hold timing check from the formula (T_LP+T_DP−T_CP).

* * * * *